United States Patent
Kondo et al.

(10) Patent No.: US 7,888,769 B2
(45) Date of Patent: Feb. 15, 2011

(54) SEMICONDUCTOR INTEGRATED CIRCUIT DEVICE

(75) Inventors: Masaki Kondo, Kanagawa (JP); Ryo Fukuda, Kanagawa (JP); Yohji Watanabe, Kanagawa (JP); Mitsutoshi Nakamura, Ibaraki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 470 days.

(21) Appl. No.: 11/756,196

(22) Filed: May 31, 2007

(65) Prior Publication Data

US 2007/0278580 A1 Dec. 6, 2007

(30) Foreign Application Priority Data

Jun. 1, 2006 (JP) .............................. 2006-153970

(51) Int. Cl.
H01L 29/00 (2006.01)
(52) U.S. Cl. ....................................... 257/529; 257/209
(58) Field of Classification Search ................. 257/209, 257/529, E21.592, E21.593, E23.149, E23.15
See application file for complete search history.

(56) References Cited

U.S. PATENT DOCUMENTS

| 5,360,988 | A  | * | 11/1994 | Uda et al. | 257/529 |
| 6,762,918 | B2 |   | 7/2004  | Voldman    |         |
| 2006/0118904 | A1 | * | 6/2006 | Liaw      | 257/529 |

* cited by examiner

Primary Examiner—Hung Vu
(74) Attorney, Agent, or Firm—Oblon, Spivak, McClelland, Maier & Neustadt, L.L.P.

(57) ABSTRACT

A semiconductor integrated circuit device according to an embodiment of the present invention includes: a semiconductor substrate; an internal circuit formed on the semiconductor substrate, a first potential and a second potential being supplied to the internal circuit, thereby applying an operating voltage to the internal circuit; a fuse disposed above a semiconductor region of a first conductivity type, and electrically connected to the internal circuit, the semiconductor region being supplied with the second potential and being formed in the semiconductor substrate; and a protective element formed in the semiconductor region of the first conductivity type and protecting the internal circuit in response to positive and negative abnormal voltages generated in a wiring through which the fuse and the internal circuit are connected to each other.

8 Claims, 17 Drawing Sheets

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2006-153970, filed on Jun. 1, 2006, the entire contents of which are incorporated herein by reference.

BACKGROUND OF THE INVENTION

The present invention relates to a semiconductor integrated circuit device having fuses, and more particularly to a semiconductor integrated circuit device which is capable of preventing each of internal circuits from being broken due to a surge current generated when a certain fuse is blown.

In a semiconductor integrated circuit device, for example, a memory device such as a DRAM or an SRAM, a fuse is used for the purpose of rearranging a wiring of a redundant circuit for relieving a defective bit in a post-process after completion of a function test. A method of blowing a fuse by applying an excessive current, a laser beam or the like to a part of a wiring layer is adopted for a fuse element provided in the semiconductor integrated circuit device. When the fuse is blown with the Joule heat due to the excessive current, the excessive current itself may break each of the internal circuits. In addition, when the fuse is blown with the laser beam, it is thought that the surge current or the like generated by charge-up due to radiation of a light beam or thermoelectronic emission, or electro static discharge (ESD) accompanying generation or the like of an intra-surface potential distribution of a wafer due to a plasma gas generated in a phase of radiation of the laser beam to the fuse may cause the breaking of each of the internal circuits.

For example, a semiconductor integrated circuit device having a gate separation type diode as a protective element is known as a conventional semiconductor integrated circuit device which can protect each of internal circuits from the above-mentioned surge current or the like. In this semiconductor integrated circuit device, a fuse is provided in the middle of a wiring through which an internal circuit is connected to a grounding potential $V_{SS}$. Also, the wiring through which the internal circuit and the fuse are connected to each other has a first gate separation type diode connected in a forward direction to a power supply potential $V_{DD}$, and a second gate separation type diode connected in a forward direction to the grounding potential $V_{SS}$. With the circuit structure described above, when a surge current having a polarity that it is caused to flow into the internal circuit is generated, the first gate separation type diode operates, while when a surge current having a polarity opposite to that polarity is generated, the second gate separation type diode operates, thereby protecting the internal circuit from the surge current. This semiconductor integrated circuit device, for example, is disclosed in U.S. Pat. No. 6,762,918.

However, the conventional semiconductor integrated circuit device as described above requires two or more protective elements per one fuse. In addition, there is encountered a problem about a responsibility to the surge current changing for a short period of time, accumulation of the electric charges due to the surge current, and the like. Thus, the conventional semiconductor integrated circuit device as described above does not have the reliability enough to protect the internal circuit from the surge current.

BRIEF SUMMARY OF THE INVENTION

A semiconductor integrated circuit device according to one embodiment of the present invention includes:
 a semiconductor substrate;
 an internal circuit formed on the semiconductor substrate, a first potential and a second potential being supplied to the internal circuit, thereby applying an operating voltage to the internal circuit;
 a fuse disposed above a semiconductor region of a first conductivity type, and electrically connected to the internal circuit, the semiconductor region being supplied with the second potential and being formed in the semiconductor substrate; and
 a protective element formed in the semiconductor region of the first conductivity type and protecting the internal circuit in response to positive and negative abnormal voltages generated in a wiring through which the fuse and the internal circuit are connected to each other.

A semiconductor integrated circuit device according to another embodiment of the present invention includes:
 a semiconductor substrate;
 an internal circuit formed on the semiconductor substrate, a first potential and a second potential being supplied to the internal circuit, thereby applying an operating voltage to the internal circuit;
 a fuse electrically connected to the internal circuit; and
 a secondary fuse interposed between the fuse and the internal circuit, the secondary fuse being formed so as to be adapted to be broken by a surge current generated when the fuse is cut.

A semiconductor integrated circuit device according to still another embodiment of the present invention includes:
 a semiconductor substrate;
 an internal circuit formed on the semiconductor substrate, a first potential and a second potential being supplied to the internal circuit, thereby applying an operating voltage to the internal circuit; and
 a plurality of fuses interposed between a first wiring to which the second potential is supplied, and a second wiring electrically connected to the internal circuit;
 in which the plurality of fuses have respective blow spots as regions in which the plurality of fuses are adapted to be cut, and a connection portion in which the plurality of fuses are integrally with the corresponding adjacent other fuses on the first wiring side with respect to centers of the blow spots.

DETAILED DESCRIPTION OF THE INVENTION

Figure 1:
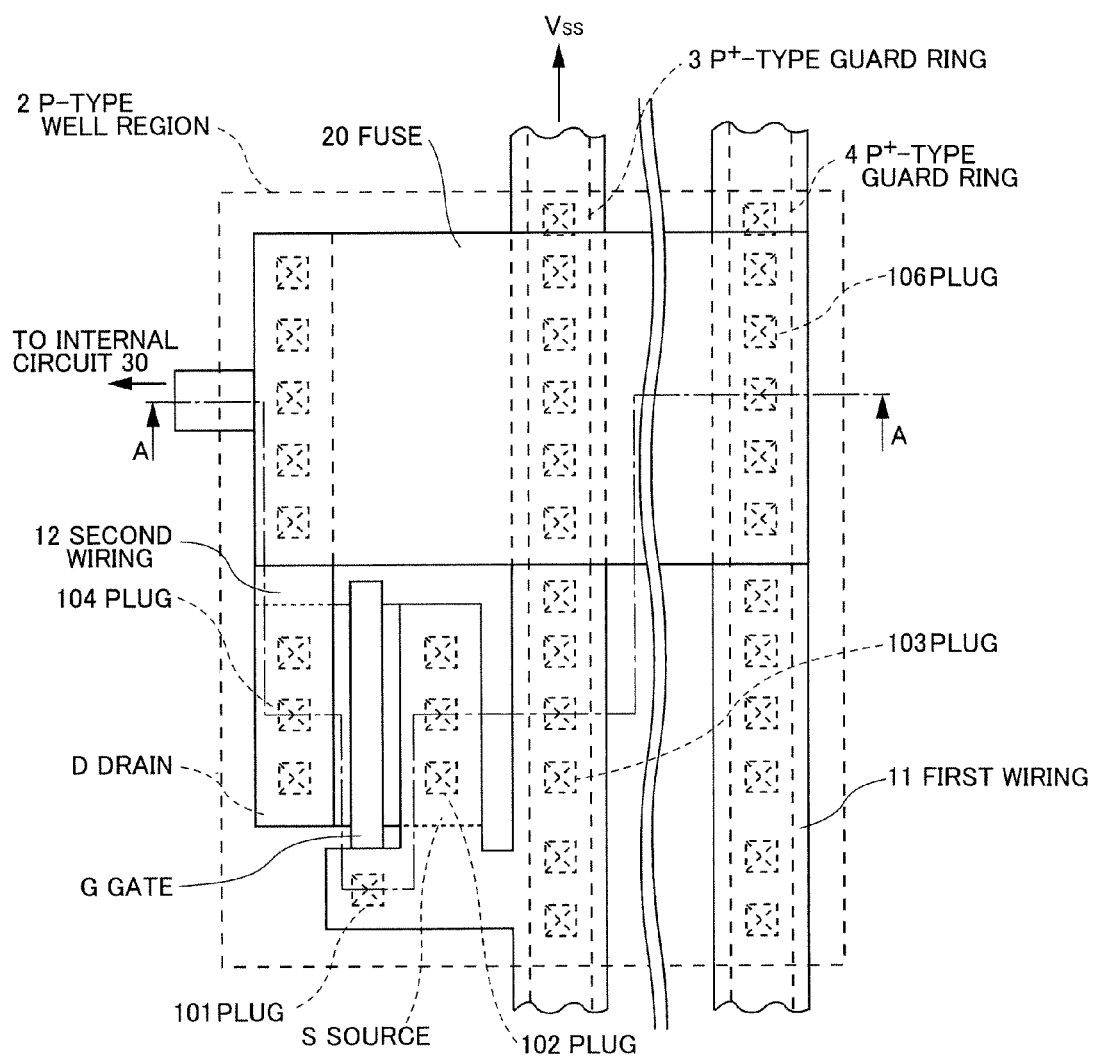
FIG. 1 is a partial top plan view showing a semiconductor integrated circuit device according to a first embodiment of the present invention.
Figure 2:
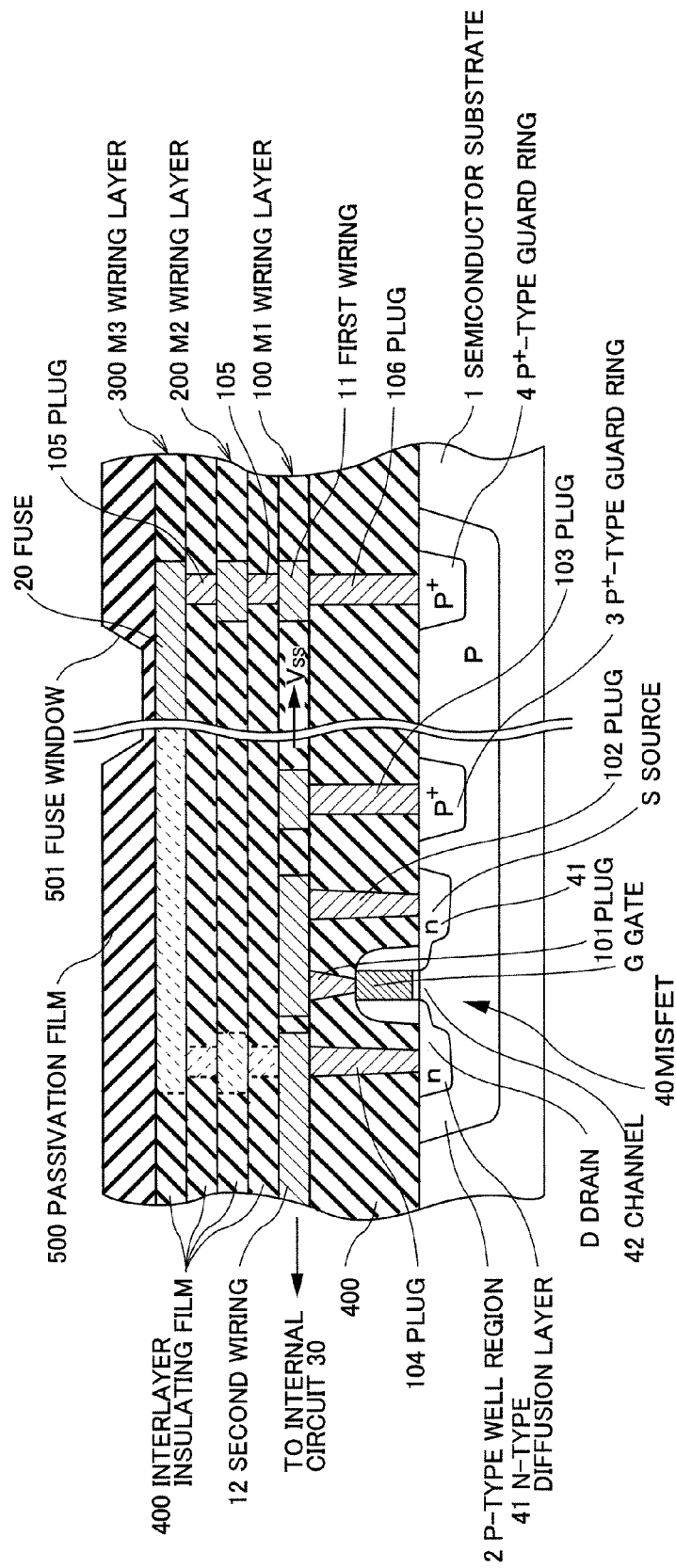
FIG. 2 is a cross sectional view taken on line A-A of FIG. 1.

FIG. 1 is a partial top plan view showing a semiconductor integrated circuit device according to a first embodiment of the present invention. FIG. 2 is a cross sectional view taken on line A-A of FIG. 1. Here, in the illustration of FIG. 1, in order to make FIG. 1 easy to see in a region other than a fuse 20, an M2 wiring layer 200, an interlayer insulating film 400, and the like are omitted herein in their illustrations as may be necessary. In addition, in the illustration of FIG. 2, in order to make a wiring through which the fuse 20 and an internal circuit are connected to each other easy to see, a wiring portion which does not appear in the cross sectional view taken on line A-A of FIG. 1 is indicated by dotted lines.

This semiconductor integrated circuit device includes a semiconductor substrate 1, an internal circuit 30 which performs a predetermined operation by receiving as its supply potentials a power supply potential $V_{DD}$ as a first potential, and a grounding potential $V_{SS}$ as a second potential, a fuse 20 interposed between a first wiring 11 to which the grounding potential $V_{SS}$ is supplied and a second wiring 12 connected to the internal circuit 30, and a MISFET 40 as a protective element which is disposed between the second wiring 12 and the grounding potential $V_{SS}$ side and which protects the internal circuit 30. In this embodiment, a P-type Si substrate is used as the semiconductor substrate 1, and an N-channel MISFET is used as the MISFET 40.

A P-type well region 2 as a semiconductor region of a first conductivity type is formed on the semiconductor substrate 1, and the MISFET 40 is formed in the P-type well region 2 so as to correspond to the fuse 20. Here, a plurality of fuses 20 are formed side by side above the P-type well region 2 so as to correspond to a plurality of internal circuits 30, respectively. Note that, the MISFET 40 may not be formed in the P-type well region 2. In this case, a part of the P-type Si substrate may be used as the semiconductor region of the first conductivity type, and the MISFET 40 may be formed in the semiconductor region in the P-type Si substrate. In addition, in this embodiment, a description will now be given with respect to the semiconductor device having a multi-layer interconnection structure including first to third layers.

The MISFET 40 has a gate G, a source S, and a drain D which are formed in the P-type well region 2 so as to correspond to the fuses 20. The gate G and the source S of the MISFET 40 are connected to an M1 wiring layer 100 through plugs 101 and 102, respectively, so that the grounding potential $V_{SS}$ is supplied thereto through a first wiring 11 formed in predetermined pattern, and each of the gate G and the source S of the MISFET 40 is connected to a P$^+$-type guard ring 3 for contact with a P-type well region 2 at a low resistance through a plug 103.

The drain D of the MISFET 40 is connected to the M1 wiring layer 100 through a plug 104, is connected to the internal circuit 30 through a second wiring 12 formed in predetermined pattern, and is connected to one end of the fuse 20 formed in an M3 wiring layer 300 as the uppermost layer.

On the other hand, the other end of the fuse 20 is connected to the M1 wiring layer 100 through the M3 wiring layer 300, a plug 105 extending between the M2 wiring layer 200 and the M3 wiring layer 300, and between the M1 wiring layer 100 and the M2 wiring layer 200, and the M2 wiring layer 200, so that the grounding potential $V_{SS}$ is supplied thereto through the first wiring 11 formed in predetermined pattern. Also, the other end of the fuse 20 is connected to a P$^+$-type guard ring 4 for contact with the P-type well region 2 at a low resistance through a plug 106. Here, the P$^+$-type guard ring 3 and the P$^+$-type guard ring 4 are high impurity concentrated regions which are continuously formed within the P-type well region 2. Also, a plurality of fuses 20 are disposed above a region surrounded by the P$^+$-type guard ring 3 and the P$^+$-type guard ring 4. A portion which is located approximately at a center of the fuse 20 is a blow spot central portion which is adapted to be blown with a laser beam radiated thereto. A fuse window 501 through which the laser beam is to be radiated to the blow spot central portion of the fuse 20 is formed in a passivation film 500 formed in the uppermost layer.

The above-mentioned MISFET 40 is a grounded gate NMOS (GGNMOS) structured so that the gate G is grounded together with the source S.

Figure 3:
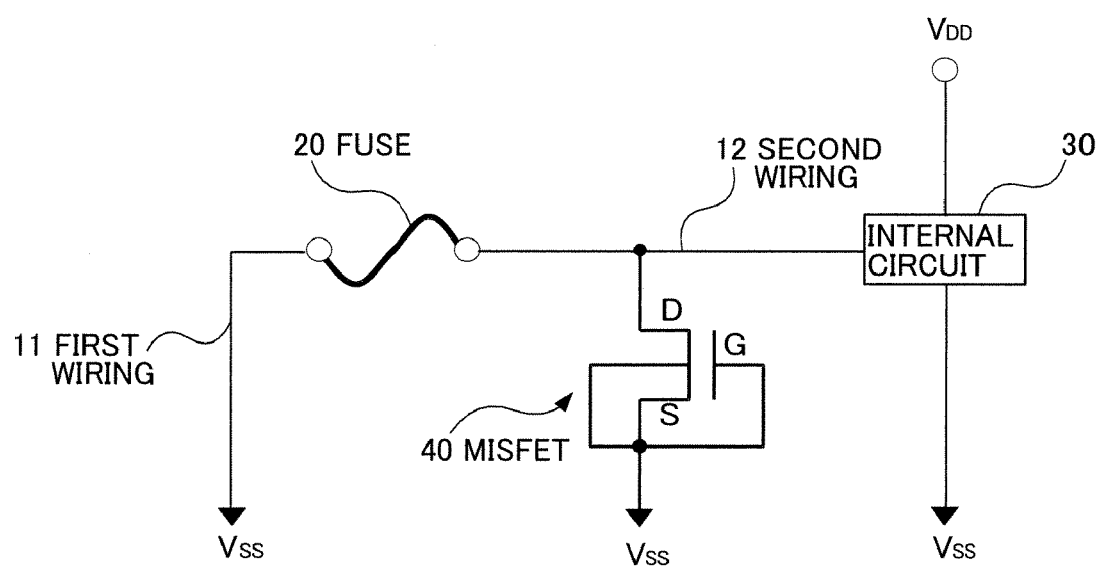
FIG. 3 is a circuit diagram showing a circuit structure of the semiconductor integrated circuit device according to the first embodiment of the present invention.
Figure 4:
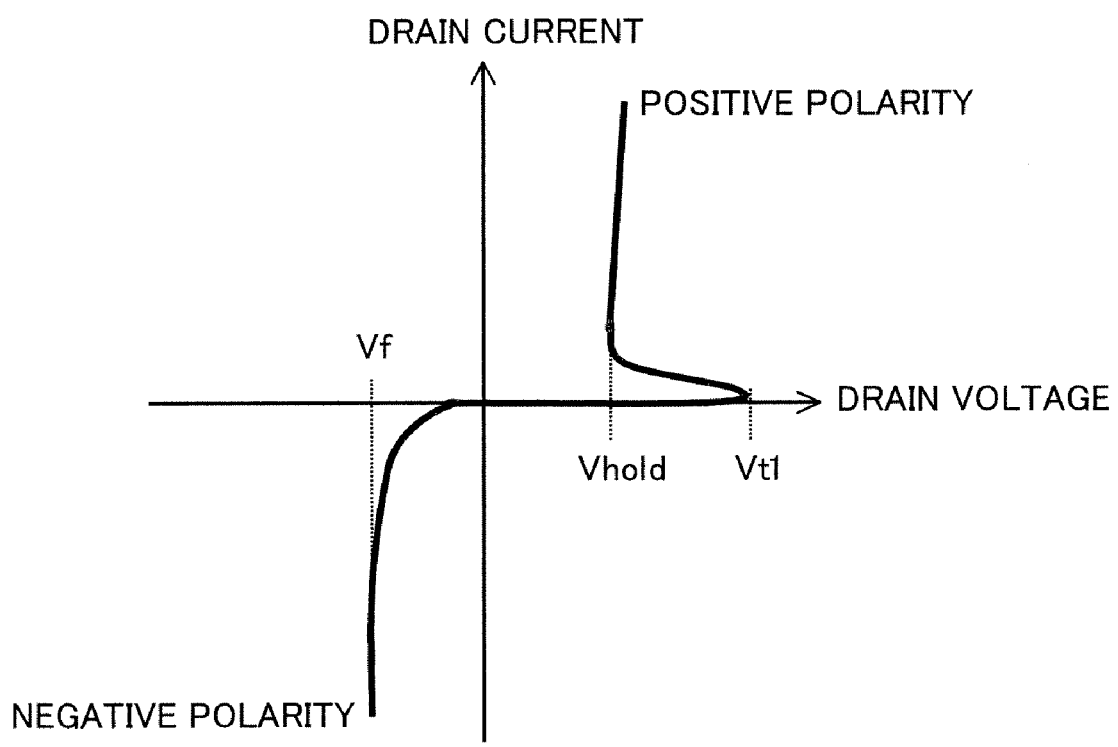
FIG. 4 is a graphical representation showing a relationship between a drain voltage and a drain current in a MISFET in the semiconductor integrated circuit device according to the first embodiment of the present invention.

FIG. 3 is a circuit diagram showing a circuit structure of the semiconductor integrated circuit device according to the first embodiment of the present invention. In addition, FIG. 4 is a graphical representation showing a relationship between a drain voltage and a drain current in the MISFET 40 in the semiconductor integrated circuit device according to the first embodiment of the present invention.

A description will be given hereinafter with respect to an operation for protecting the internal circuits 30 from a surge current when the fuse 20 is blown to generate the surge current.

In a phase of a normal circuit operation when the grounding potential $V_{SS}$ and the power supply potential $V_{DD}$ are supplied to the internal circuit 30, the potential of the second wiring 12 is not lower than the grounding potential $V_{SS}$ and not higher than the power supply potential $V_{DD}$. Therefore, the MISFET 40 as the protective element is in a non-conduction state, and thus exerts no influence on the operation of the internal circuits 30.

When the fuse 20 is blown, so that the surge current is generated in a direction (corresponding to a positive polarity)

of flowing from the fuse 20 thus blown into the internal circuit 30, a parasitic NPN bipolar transistor is turned ON, thereby forming a low resistance path between the drain D and the source S of the MISFET 40. Thus, the electric charges originating from the surge current having the positive polarity are discharged to the grounding potential $V_{SS}$ side through the second wiring 12, and the drain D and the source S of the MISFET 40.

On the other hand, when the surge current is generated in an opposite direction (corresponding to a negative polarity), a diode constituted by an N-type diffusion layer 41 of the drain D of the MISFET 40, and the P-type well region 2 is biased in a forward direction, thereby forming a low resistance path between the drain D of the MISFET 40, and the P-type well region 2. Since an inversion layer is induced in a surface of a channel 42 concurrently with formation of the low resistance path between the drain D of the MISFET 40, a low resistance path is also formed between the drain D and the source S of the MISFET 40. Thus, the electric charges originating from the surge current having the negative polarity are discharged to the grounding potential $V_{SS}$ side through the two low resistance paths. Therefore, even when the surge current having any of the positive polarity and the negative polarity is generated, the MISFET 40 as the protective element becomes the conduction state.

In this embodiment, the protective element is formed by forming the N-channel MISFET 40 either in the P-type well region 2 or in the P-type Si substrate 1. Alternatively, a protective element can also be formed by forming a P-channel MISFET either in an N-type well region or in an N-type Si substrate. In this case, the relationship between the power supply potential $V_{DD}$ as the first potential, and the grounding potential $V_{SS}$ as the second potential is reversed.

According to the first embodiment of the present invention, even when the surge current having any of the positive polarity and the negative polarity is generated, the fuse 20 is short-circuited to the grounding potential $V_{SS}$ side, so that the electric charge originating from the surge current are discharged to the semiconductor substrate 1. Therefore, it is suppressed that the surge current is caused to flow into each of the internal circuits 30, and thus each of the internal circuits 30 can be protected from the surge current. In the prior art, in order to protect each of the internal circuits from the surge current having any of the positive polarity and the negative polarity, the two protective elements are required for one fuse. Thus, the electric charges originating from the surge current having one polarity must be discharged to the grounding side, while the electric charges originating from the surge current having the other polarity must be discharged to the power supply side. Therefore, there is caused such a problem that the operation of the semiconductor integrated circuit device becomes unstable and so forth because the electric charges are accumulated in a capacitor formed between the well region and the substrate in at least one of the two cases, so that a threshold voltage fluctuates, and so forth. On the other hand, in this embodiment, no electric charge is accumulated in the well region because all the electric charges generated by blowing the fuse 20 are discharged to the semiconductor substrate 1. As a result, each of the internal circuits 30 can be protected from the surge current, and thus the semiconductor integrated circuit device can stably operate.

In addition, although in the conventional semiconductor integrated circuit device, load voltages are applied to the respective internal circuits only for a period of time for accumulation of the electric charges in a well-to-substrate capacitor, in the semiconductor integrated circuit device of this embodiment, the load voltages are applied to the respective internal circuits 30 only for a period of time for flowing of the surge current into each of the internal circuits 30.

Moreover, this embodiment also offers an effect that as shown in FIG. 4, the load voltage applied to the internal circuit 30 in the phase of flowing of the surge current having the positive polarity can be reduced from conventional one of about $V_{t1}$ into about $V_{hold}$.

Furthermore, the conventional semiconductor integrated circuit device involves a problem that the diode cannot respond to the surge current changing for a short period of time because of its slow response speed. However, this embodiment can offers an effect that each of the parasitic bipolar transistor in the phase of flowing of the surge current having the positive polarity, and the inversion layer in the phase of flowing of the surge current having the negative polarity can respond to the surge current as well changing for a short period of time because each of them has a high response speed.

In addition, the conventional semiconductor integrated circuit device requires the two protective elements (the four protective elements when the internal circuits are provided in both the ends of the fuse, respectively) constituted by the first and second gate separation type diodes per one fuse, which causes a problem that a circuit area increases. On the other hand, in the semiconductor integrated circuit device of this embodiment, the protective element can be constituted by one MISFET. Thus, the protective element can be constituted by one N-channel MISFET formed either on the P-type substrate or on the P-type well region per one fuse, or by one P-channel MISFET formed either on the N-type substrate or on the N-type well region per one fuse. Therefore, the structure becomes unnecessary which has the P-type substrate and the N-type well region, or the N-type substrate and the P-type well region which are conventionally required to form the protective elements. Consequently, this embodiment offers an effect that a reduction in area, and simplification of the process become possible because the protective elements can be formed within the well regions below the respective fuses.

In addition, in this embodiment, the P$^+$-type guard rings 3 and 4 are continuously formed within the P-type well region 2, and a plurality of fuses 20 are disposed above the region surrounded by the P$^+$-type guard rings 3 and 4. In addition, the MISFET 40 as the protective element is formed in the P-type well region 2 formed outside the P$^+$-type guard rings 3 and 4, and the internal circuit 30 is also formed outside the P$^+$-type guard rings 3 and 4. Thus, the electric charges originating from the surge current generated when the fuse 20 is blown with the laser beam radiated thereto are mainly absorbed within the P-type well region 2 surrounded by the P$^+$-type guard rings 3 and 4 in which the elements or the like are not disposed. Therefore, it can be suppressed that the internal circuit 30 or the MISFET 40 is broken due to the blowing of the fuse 20. Consequently, this embodiment can offer an effect that it is possible to realize the highly reliable semiconductor integrated circuit device, and it is also possible to realize an improvement in a yield and a reduction in cost in the manufacturing process.

Figure 5:
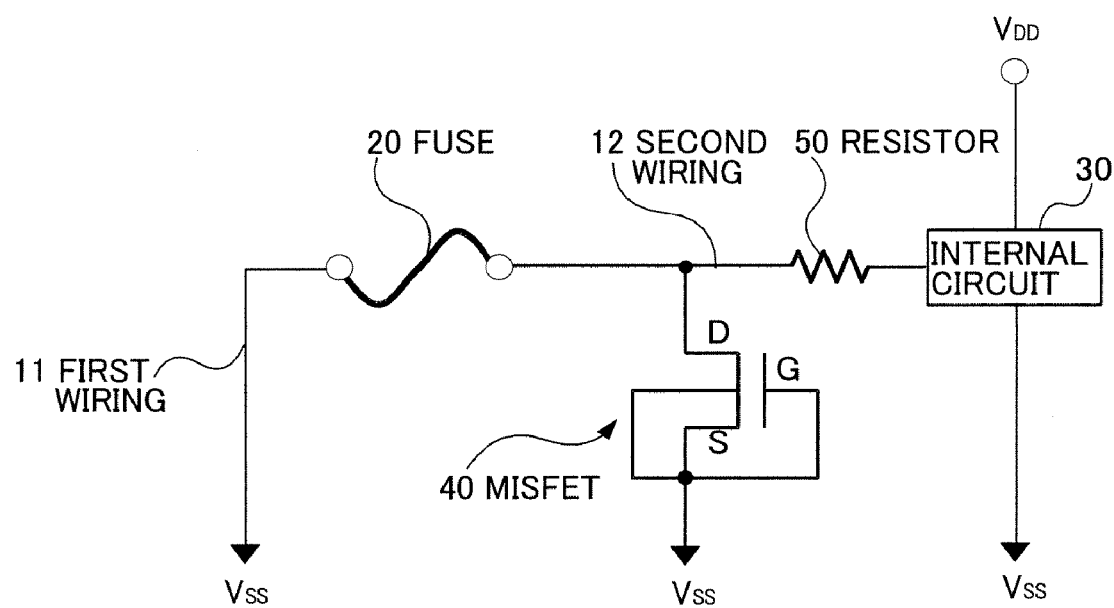
FIG. 5 is a circuit diagram showing a semiconductor integrated circuit device according to a second embodiment of the present invention.

FIG. 5 is a circuit diagram showing a semiconductor integrated circuit device according to a second embodiment of the present invention. The semiconductor integrated circuit device according to the second embodiment of the present invention is different from the semiconductor integrated circuit device of the first embodiment in that the fuse 20 is connected to the internal circuit 30 through a resistor 50 as a buffer resistor, and is also connected to the drain D of the MISFET 40. The semiconductor integrated circuit device of the second embodiment is similar in other structural respects to the semiconductor integrated circuit device of the first embodiment.

The basic operation of the MISFET 40 as the protective element is similar to that of the MISFET 40 in the semiconductor integrated circuit device of the first embodiment. When a source or a drain of an element constituting the internal circuit 30 is connected to the second wiring 12, this element in the internal circuit 30 may cause snap-back to be broken concurrently with the snap-back of the MISFET 40. In order to prevent this situation, the circuit design must be made so that a voltage $V_{t1}$ of the element in the internal circuit 30 becomes higher than that of the MISFET 40. However, it is difficult to make such a circuit design in many cases. Thus, the disposition of the resistor 50 as the buffer resistor results in that even when the element in the internal circuit 30 causes the snap-back, it is possible to suppress the flowing of a destructive current into the internal circuit 30. In addition, when a gate of the element constituting the internal circuit 30 is connected to the second wiring 12, there is offered such an effect that a time constant of a rise in the gate potential is prolonged to lighten a damage.

Consequently, according to the second embodiment of the present invention, in addition to the effects peculiar to the first embodiment, there is offered an effect that the effect of protecting the internal circuit 30 can be further enhanced by using the MISFET 40 and the resistor 50 together with each other.

Figure 6:
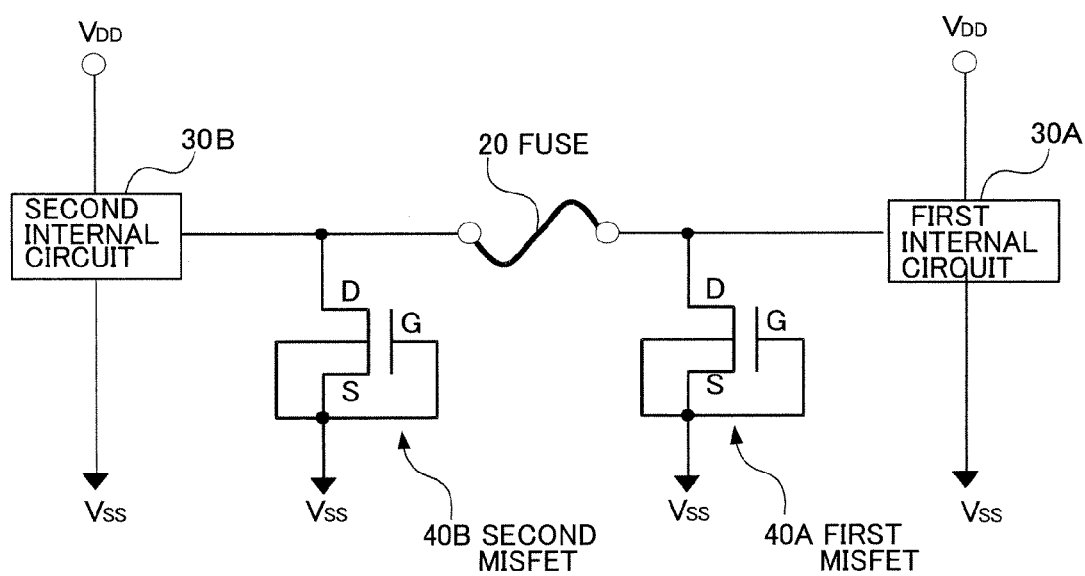
FIG. 6 is a circuit diagram showing a semiconductor integrated circuit device according to a third embodiment of the present invention.

FIG. 6 is a circuit diagram showing a semiconductor integrated circuit device according to a third embodiment of the present invention. The semiconductor integrated circuit device of the third embodiment is different from the semiconductor integrated circuit device of the first embodiment in that a first internal circuit 30A, a second internal circuit 30B, a first MISFET 40A, and a second MISFET 40B are disposed symmetrically in terms of a circuit structure with respect to the disposition position of the fuse 20. This structure can be readily realized by forming the MISFET 40, the P$^+$-type guard rings 3 and 4, and the like in a mirror-symmetrical manner in terms of a circuit structure with respect to the disposition position of the fuse 2 in FIG. 1. The semiconductor integrated circuit device of the third embodiment is similar in other structural respects to the semiconductor integrated circuit device of the first embodiment.

The basic operation and effect of each of the first and second MISFETs 40A and 40B as the protective elements are similar to those of the MISFET 40 in the semiconductor integrated circuit device of the first embodiment. According to the third embodiment of the present invention, even when the surge current having any of the positive polarity and the negative polarity is generated, the electric charges originating from the surge current are discharged from the fuse 20 to the grounding potential $V_{SS}$ side through the first MISFET 40A or the second MISFET 40B. Consequently, the breaking of the first and second internal circuits 30A and 30B due to the generation of the surge current in the phase of the blowing of the fuse 20 can be suppressed, thereby protecting each of the first and second internal circuits 30A and 30B from the surge current.

Figure 7:
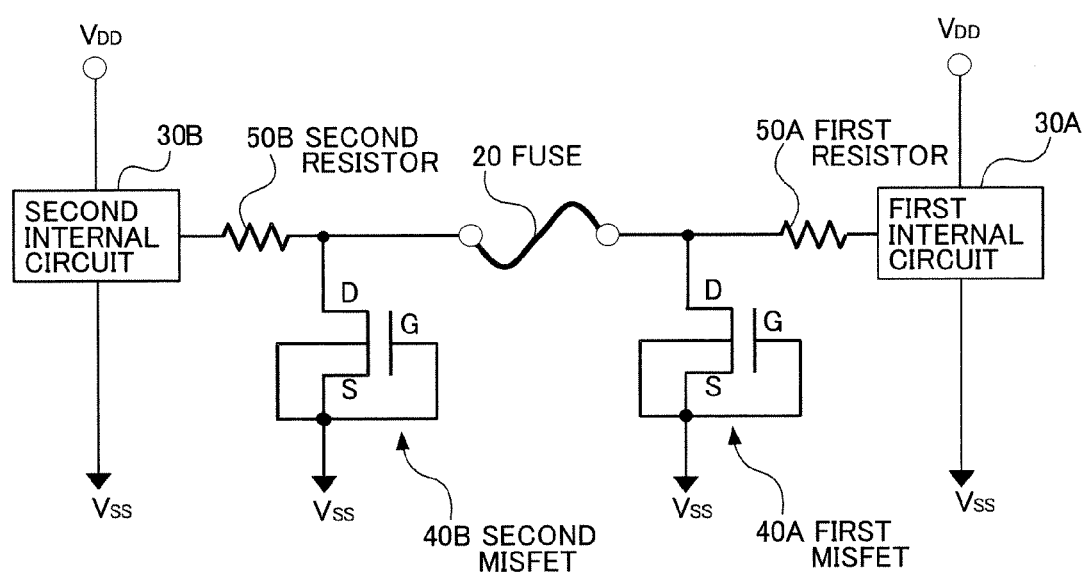
FIG. 7 is a circuit diagram showing a semiconductor integrated circuit device according to a fourth embodiment of the present invention.

FIG. 7 is a circuit diagram showing a semiconductor integrated circuit device according to a fourth embodiment of the present invention. The semiconductor integrated circuit device of the fourth embodiment is different from the semiconductor integrated circuit device of the second embodiment in that the first internal circuit 30A, the second internal circuit 30B, the first MISFET 40A, the second MISFET 40B, a first resistor 50A, and a second resistor 50B are disposed symmetrically in terms of a circuit structure with respect to the disposition position of the fuse 20. The semiconductor integrated circuit device of the fourth embodiment is similar in other structural respects to the semiconductor integrated circuit device of the second embodiment. Also, the basic operation and effect of each of the first and second MISFETs 40A and 40B as the protective elements are similar to those of the MISFET 40 in the semiconductor integrated circuit device of the second embodiment.

That is to say, according to the fourth embodiment of the present invention, even when the surge current having any of the positive polarity and the negative polarity is generated, the electric charges originating from the surge current are discharged from the fuse 20 to the grounding potential $V_{SS}$ side through the first MISFET 40A or the second MISFET 40B.

In addition, the disposition of the first and second resistors 50A and 50B as the buffer resistors results in that even when the elements provided in the first and second internal circuits 30A and 30B, respectively, cause the snap-back, it is possible to suppress the flowing of the destructive currents into the first and second internal circuits 30A and 30B. Consequently, the breaking of the first and second internal circuits 30A and 30B due to the generation of the surge current in the phase of the blowing of the fuse 20 can be suppressed, thereby protecting the first and second internal circuits 30A and 30B from the surge current.

Figure 8:
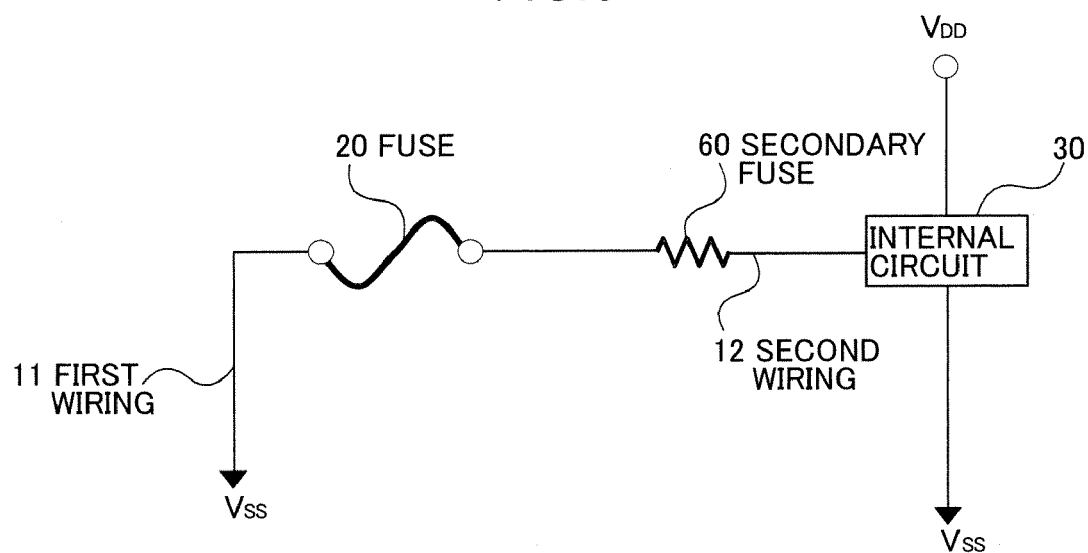
FIG. 8 is a circuit diagram showing a semiconductor integrated circuit device according to a fifth embodiment of the present invention.

FIG. 8 is a circuit diagram showing a semiconductor integrated circuit device according to a fifth embodiment of the present invention. The semiconductor integrated circuit device of the fifth embodiment includes the semiconductor substrate 1, the internal circuit 30 which performs a predetermined operation by receiving as its supply potentials the power supply potential $V_{DD}$ as the first potential, and the grounding potential $V_{SS}$ as the second potential, the fuse 20 interposed between the first wiring 11 to which the grounding potential $V_{SS}$ is supplied, and the second wiring 12 connected to the internal circuit 30, and a secondary fuse 60 interposed between the fuse 20 and the internal circuit 30.

Here, the fuse 20 is adapted to be blown with the laser beam radiated thereto, and, for example, is similar to that of the first embodiment shown in FIG. 3. In addition, the secondary fuse 60 is formed in the form of a resistor in the semiconductor integrated circuit device as an electrical fuse which can be broken by the flowing of the surge current generated in the phase of the cutting of the fuse 20.

Figure 9:
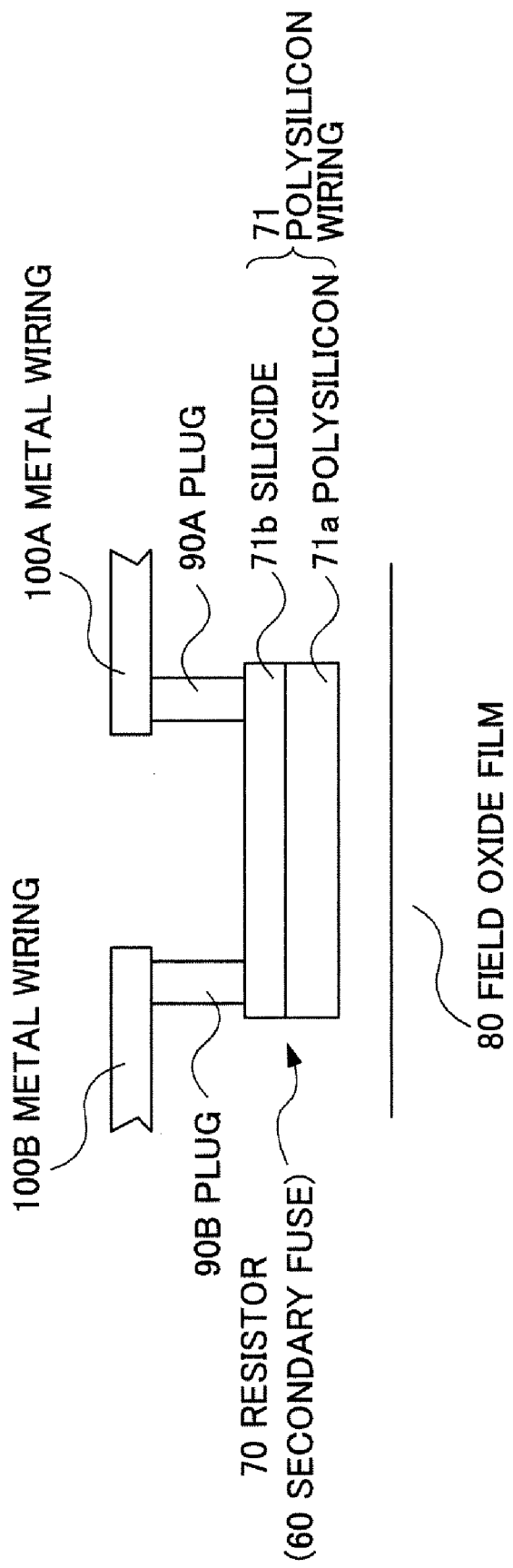
FIG. 9 is a side elevational view of a resistor provided in the semiconductor integrated circuit device according to the fifth embodiment of the present invention.

FIG. 9 is a side elevational view showing a resistor 70 as the secondary fuse 60 which is formed in the form of a polysilicon wiring 71 formed on a field oxide film 80 in the semiconductor integrated circuit device of the fifth embodiment.

The resistor 70 is formed in the form of the polysilicon wiring 71 in predetermined shape on the field oxide film 80. One end of the resistor 70 is connected to the internal circuit (not shown) 30 through a plug 90A and a metal wiring 100A, and the other end thereof is connected to the fuse (not shown) 20 through a plug 90B and a metal wiring 100B. In addition, the resistor 70 includes a non-doped polysilicon layer 71a and a silicide layer 71b formed on the non-doped polysilicon layer 71a. In addition, a width and a length of the silicide layer 71b functioning as the resistor are prescribed, which results in that the silicide layer 71b formed on the non-doped polysilicon layer 71a is adapted to be blown by the flowing of a current smaller than a breaking capacity of the internal circuit 30.

Figure 10:
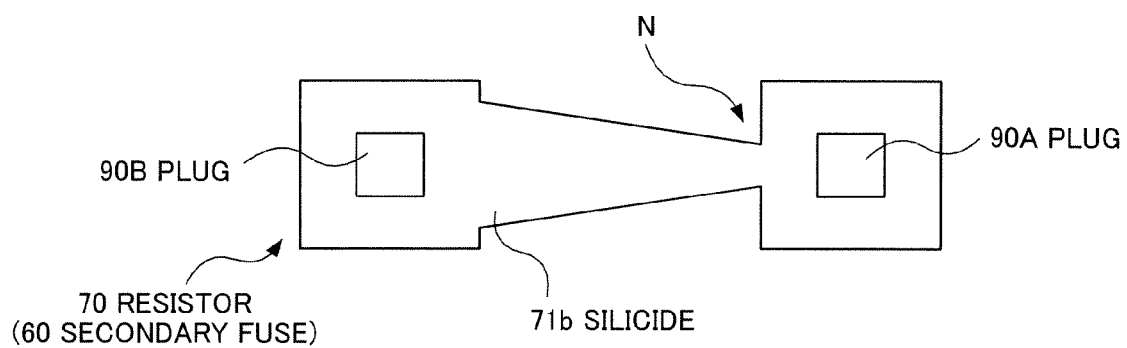
FIG. 10 is a top plan view of the resistor provided in the semiconductor integrated circuit device according to the fifth embodiment of the present invention.

FIG. 10 is a top plan view showing that the resistor 70 shown in FIG. 9 is formed in tapered shape as a shape of the polysilicon wiring 71. Application of such a layout results in that a portion N, which is narrow in width, of the tapered shape of the silicide layer 71b has a high resistance value. Thus, the narrow portion N has a high blowing property. In addition, a tungsten wiring can be used instead of the polysilicin wiring. In this case, since an electro-migration resistance in an interface between the tungsten wiring and the plug is weak, the breaking is easy to generate in a composition plane.

The fifth embodiment of the present invention can also be used together with the first to fourth embodiments. According to the fifth embodiment of the present invention, the resistor 70 of the secondary fuse 60 is blown due to the surge current irrespective of the polarity of the surge current before the internal circuit 30 is broken. As a result, the flowing of the surge current into the internal circuit 30 is cut off. For this reason, the fifth embodiment offers an effect that the internal circuit 30 is effectively protected from the surge current.

In addition, the polysilicon wiring 71 or the tungsten wiring can be readily realized in the general integrated circuit manufacturing process, and thus can be formed by merely replacing a part of the metal wiring therewith. Consequently, the fifth embodiment offers an effect that the internal circuit 30 can be effectively protected from the surge current with a lower cost than that in the conventional one without increasing a circuit area.

Figure 11:
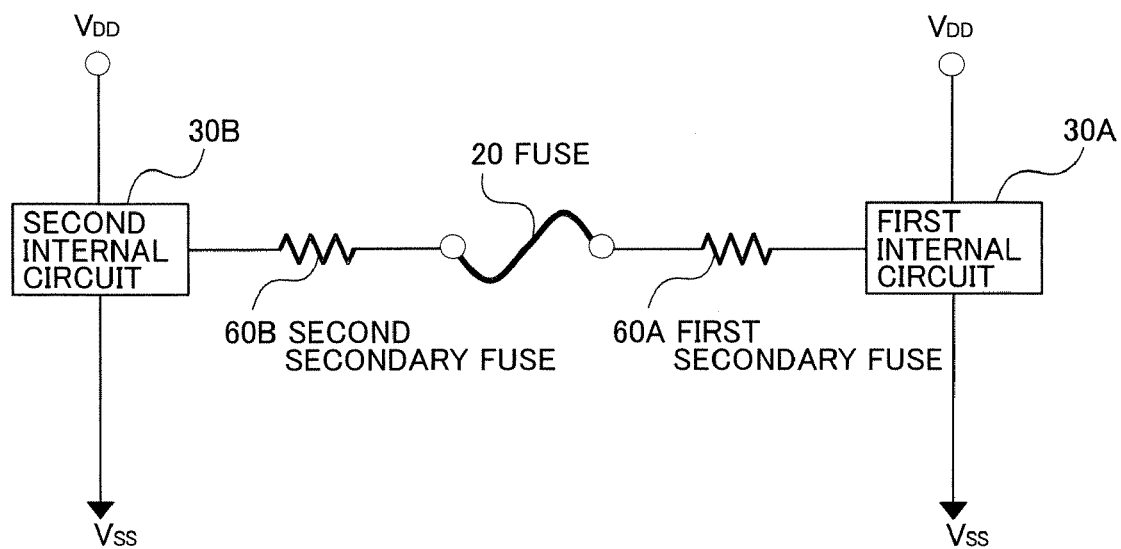
FIG. 11 is a circuit diagram showing a semiconductor integrated circuit device according to a sixth embodiment of the present invention.

FIG. 11 is a circuit diagram showing a semiconductor integrated circuit device according to a sixth embodiment of the present invention. The semiconductor integrated circuit device of the sixth embodiment is different from the semiconductor integrated circuit device of the fifth embodiment in that a first internal circuit 30A, a second internal circuit 30B, a first secondary fuse 60A, and a second secondary fuse 60B are disposed symmetrically in terms of a circuit structure with respect to the disposition position of the fuse 20. The semiconductor integrated circuit device of the sixth embodiment is similar in other structural respects to that of the fifth embodiment.

The basic operation and effect of each of the first secondary fuse 60A and the second secondary fuse 60B is similar to those of the secondary fuse 60 of the fifth embodiment shown in FIGS. 8 to 10. According to the sixth embodiment of the present invention, even when the surge current having any of the positive polarity and the negative polarity is generated, the resistor in the first secondary fuse 60A or the second secondary fuse 60B is blown before the first and second internal circuits 30A and 30B are broken, and thus the flowing of the surge current into each of the first and second internal circuits 30A and 30B is cut off. As a result, the breaking of each of the first and second internal circuits 30A and 30B can be suppressed, thereby protecting each of the first and second internal circuits 30A and 30B from the surge current.

Consequently, in addition to the effects of the fifth embodiment of the present invention, there is offered an effect that use of the first and second secondary fuses 60A and 60B for one fuse 20 makes it possible to protect two internal circuits, which are the first and second internal circuits 30A and 30B, from the surge current.

Note that, the sixth embodiment can also be used together with the third and fourth embodiments.

Figure 12:
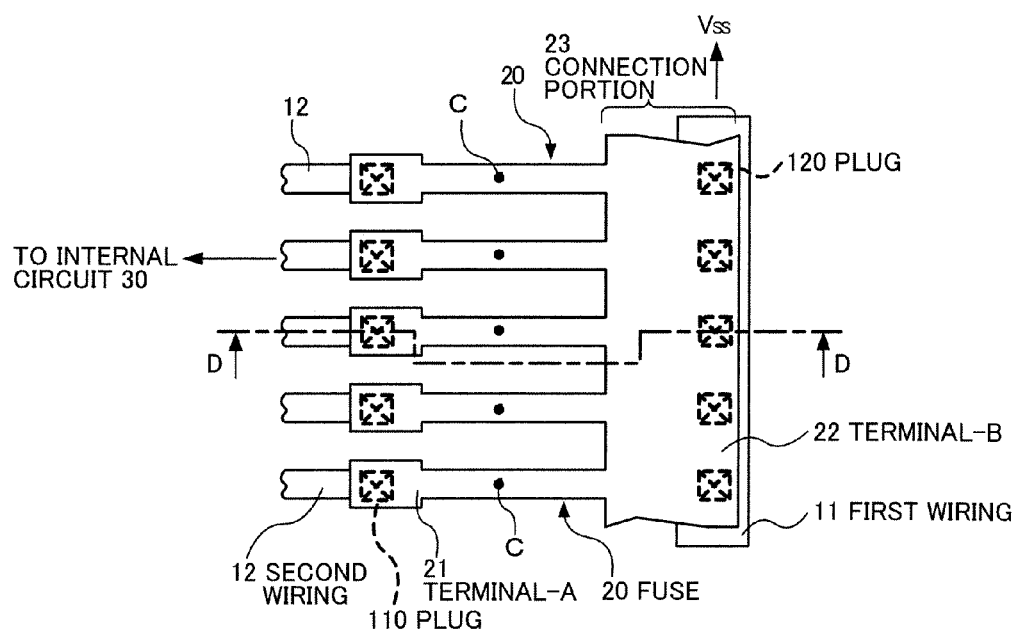
FIG. 12 is a top plan view showing a semiconductor integrated circuit device according to a seventh embodiment of the present invention.
Figure 13:
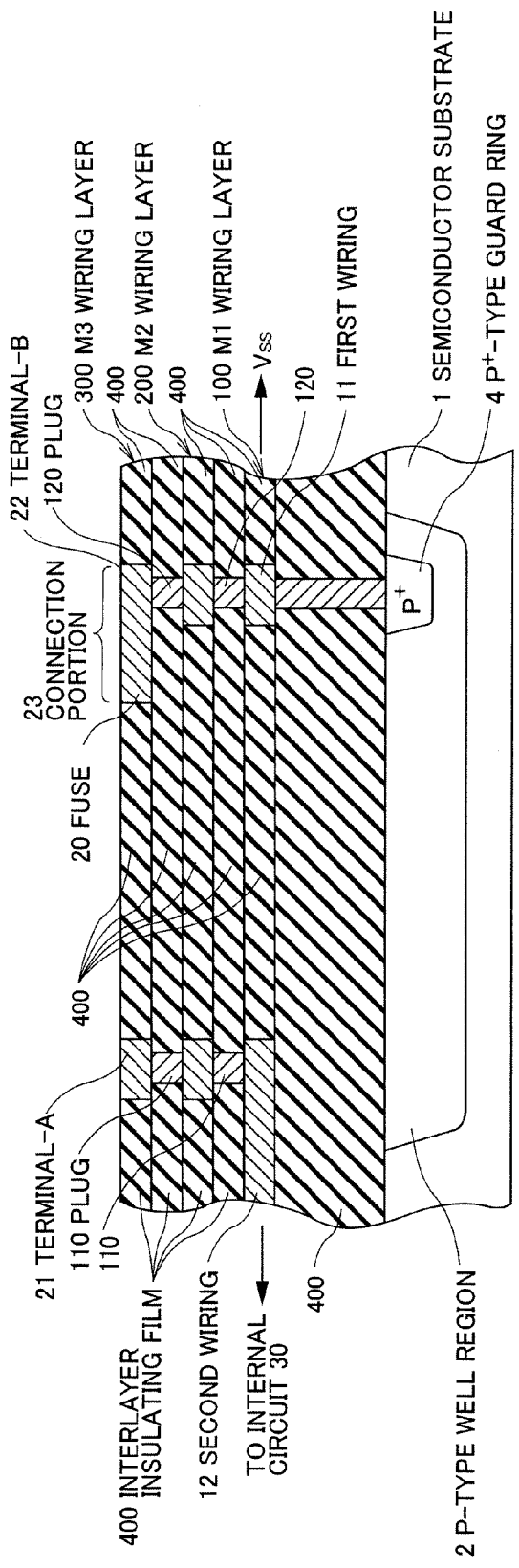
FIG. 13 is a cross sectional view taken on line D-D of FIG. 12.

FIG. 12 is a top plan view showing a semiconductor integrated circuit device according to a seventh embodiment of the present invention. In addition, FIG. 13 is a cross sectional view taken on line D-D of FIG. 12. Note that, in the illustration of FIG. 12, in order to make the figure easy to see in a region other than the fuse 20, the M2 wiring layer 200, the interlayer insulating film 400, and the like are omitted here in their illustrations as may be necessary.

The semiconductor integrated circuit device of the seventh embodiment includes the substrate 1, the internal circuit 30 which performs a predetermined operation by receiving as its supply potentials the power supply potential $V_{DD}$ as the first potential, and the grounding potential $V_{SS}$ as the second potential, and a plurality of fuses 20 interposed between the first wiring 11 to which the grounding potential $V_{SS}$ is supplied, and a plurality of second wirings 12 connected to the respective internal circuits 30.

A plurality of terminals-A 21 of a plurality of fuses 20 are connected to the respective internal circuits 30 through respective plugs 110. Portions each having a narrow wiring width between the terminals-A 21 and a terminal-B 22 are blow spot central portions C. Referring to FIG. 13, the terminal-B 22 is connected to the first wiring 11 through the M2 wiring layer 200 and a plug 120 extending between the M3 wiring layer 300 and the M2 wiring layer 200, and between the M2 wiring layer 200 and the M1 wiring layer 100. Also, the grounding potential $V_{SS}$ is supplied to the terminal-B 22.

The fuses 20 have a connection portion 23 in common in which the fuses 20 are formed integrally with the corresponding adjacent other fuses 20 in a region having the terminal-B 22 provided on the first wiring 11 side with respect to each of the blow spot central portions C.

The operation of the connection portion 23 makes it possible to suppress a wiring resistance between each of the blow spot central portions C and the grounding potential $V_{SS}$. When it is assumed that the resistance value of the connection portion 23 is negligibly smaller than that of each of the plugs 120, a resistance value R of the wiring having the connection portion 23 becomes 1/n of that of the wiring having no connection portion (n: the number of fuses). In order to explain this effect, firstly, let us consider a state in which the fuse wiring is not perfectly blown. In this case, the atoms in the wiring material exist in a liquid state in the blow spot central portion C. Since the metal has the conductivity even in a liquid state, the conduction is held between each of the terminals-A 21, and the terminal-B 22 in this state. The electric charges originating from the surge current generated at a certain blow spot central portion C are discharged through two paths. That is to say, the electric charges are discharged to the grounding potential $V_{SS}$ side through the corresponding terminal-A 21 and the corresponding internal circuit 30, while they are discharged to the grounding potential $V_{SS}$ side through the terminal-B 22, the corresponding plug 120, and the like.

Figure 14A:
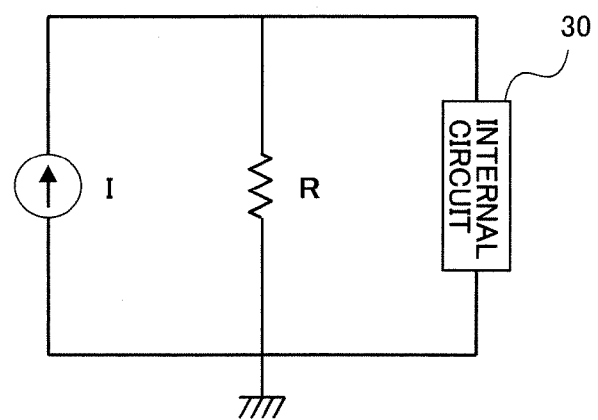
FIG. 14A is a circuit diagram showing a path in a circuit through which a surge current generated in a central portion of a certain blow spot of a fuse is caused to flow in the semiconductor integrated circuit device according to the seventh embodiment of the present invention.
Figure 14B:
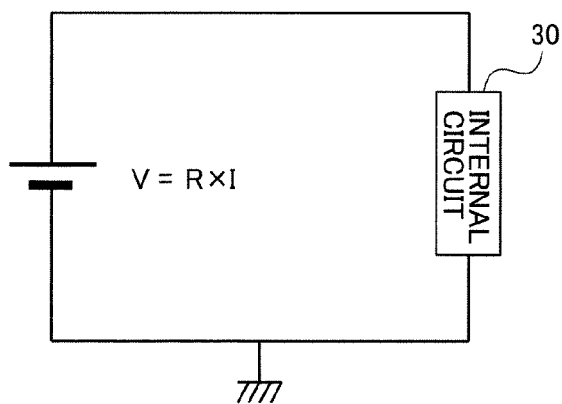
FIG. 14B is a circuit diagram showing an equivalent circuit of the circuit shown in FIG. 14A.

FIG. 14A is a circuit diagram showing a path in a circuit through which the surge current generated at the certain blow spot central portion C is caused to flow, and FIG. 14B is a circuit diagram showing an equivalent circuit of the circuit shown in FIG. 14A. In FIG. 14A, reference symbol I designates the surge current, and reference symbol R designates the wiring resistance on the terminal-B 22 side. Since an input resistance of the internal circuit 30 is normally much longer than the wiring resistance R, the circuit shown in FIG. 14A can be equivalently expressed in the form of the circuit shown in FIG. 14B. Referring now to FIG. 14B, a voltage V applied to the internal circuit 30 is given by the product of the surge current I and the wiring resistance R. It is easily supported that the probability that the internal circuit 30 will be broken increases as the voltage V becomes larger. Therefore, in order to suppress the breaking of the internal circuit 30, the wiring resistance R is preferably reduced. The reduction in wiring resistance R can be attained by adopting the structure in which the fuses 20 have the connection portion 23 in common in which the fuses 20 are formed integrally with the corresponding adjacent other fuses 20 in the region having the terminal-B 22 provided on the first wiring 11 side with respect to each of the blow spot central portions C.

Next, let us consider a state in which the certain fuse 20 is perfectly blown. Since the generated surge current itself is reduced in this state, the influence of the surge current exerted on the breaking probability is small. The plasma of the atoms of the wiring material may be generated at the blow spot central portion C of the certain fuse 20 depending on the blow conditions. Since the plasma has the conductivity, the above description given when the wiring is not perfectly blown is applied to this case as it is. Therefore, the effect of the connection portion 23 is effective even in the state in which the wiring is perfectly blown.

According to the seventh embodiment of the present invention, the wiring resistance between each of the blow spot central portions C and the grounding potential $V_{SS}$ side can be reduced in accordance with the operation of the connection portion 23 in which one ends of the fuses 20 are formed integrally with the corresponding adjacent other fuses 20. Therefore, an amount of electric charges which originate from the surge current in the phase of the fuse 20 blowing and which are caused to flow into the internal circuit 30 can be reduced. As a result, the breaking of the internal circuit 30 can be efficiently suppressed, thereby protecting each of the internal circuits 30 from the surge current.

Here, when the semiconductor integrated circuit device has the multi-layer interconnection structure, for example, the M2 wiring layer 200 shown in FIG. 13 may also be formed so that one ends of a plurality of fuses shown in FIG. 12 are formed integrally with the corresponding adjacent other fuses 20. In addition, the seventh embodiment of the present invention can also be used together with the first, second and fifth embodiments.

Figure 15:
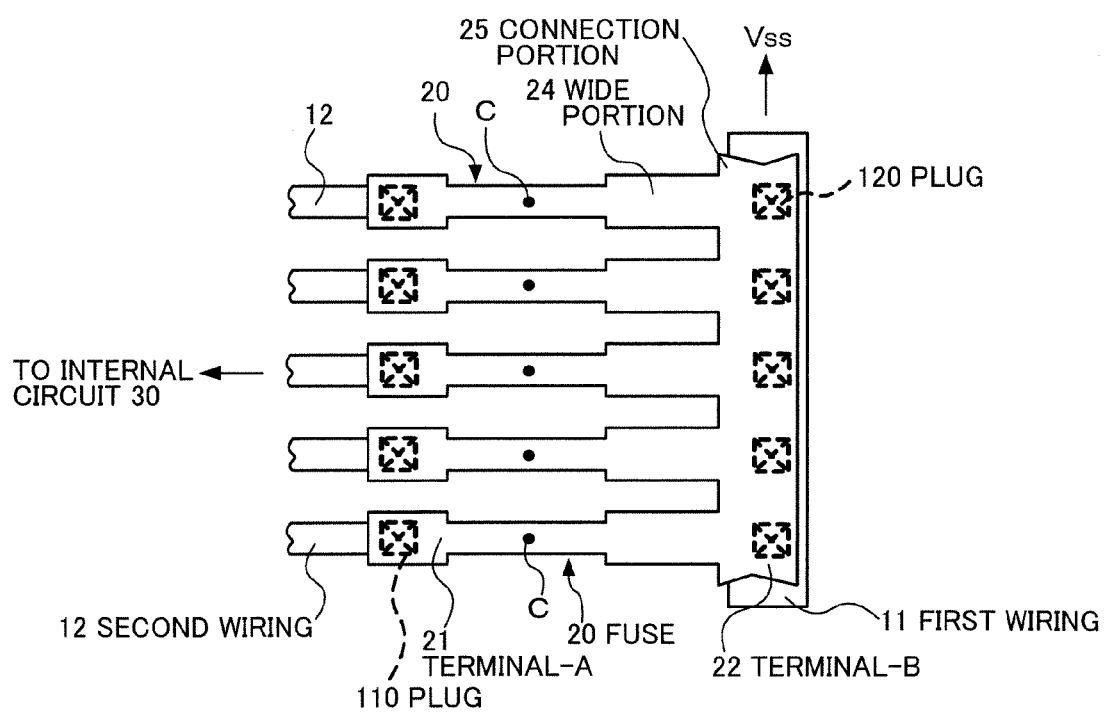
FIG. 15 is a top plan view showing a semiconductor integrated circuit device according to an eighth embodiment of the present invention.

FIG. 15 is a top plan view showing a semiconductor integrated circuit device according to an eighth embodiment of the present invention. The semiconductor integrated circuit device of the eighth embodiment is different from the semiconductor integrated circuit device of the seventh embodiment shown in FIGS. 12 to FIG. 14B in that each of the fuses 20 has a wide portion 24. Each of the wide portions 24 is formed between each of the blow spot central portions C and a connection portion 25, and has a fuse width wider than that of each of the blow spot central portions C. The basic operation of the connection portion 25 and each of the wide portions 24 is similar to that of the connection portion 23 in the seventh embodiment shown in FIG. 12.

According to the eighth embodiment of the present invention, the wiring resistance between each of the blow spot central portions C and the grounding potential $V_{SS}$ side can be reduced in accordance with the operation of the connection portion 25 in which the fuses 20 each having the wide portion 24 are formed integrally with the corresponding adjacent other fuses 20. Therefore, an amount of electric charges which originate from the surge current in the phase of the fuse 20 blowing and which are caused to flow into each of the internal circuits 30 can be reduced. As a result, the breaking of each of the internal circuits 30 can be efficiently suppressed, thereby protecting each of the internal circuits 30 from the surge current.

Note that, the eighth embodiment of the present invention can also be used together with the first, second and fifth embodiments.

Figure 16:
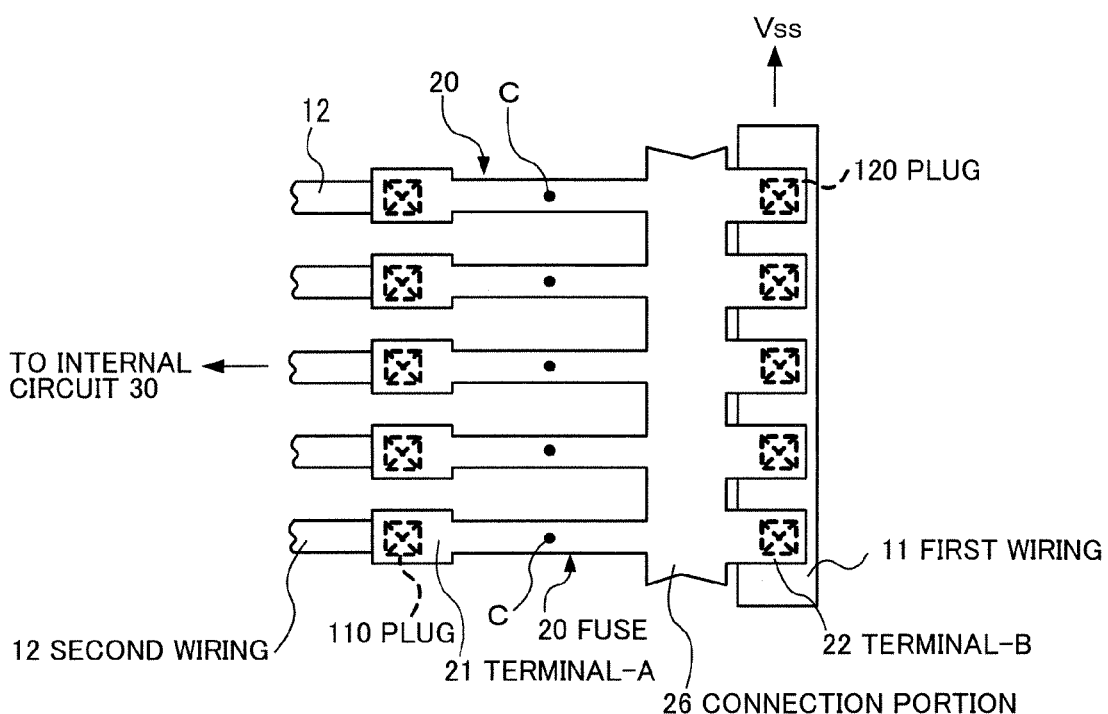
FIG. 16 is a top plan view showing a semiconductor integrated circuit device according to a ninth embodiment of the present invention.

FIG. 16 is a top plan view showing a semiconductor integrated circuit device according to a ninth embodiment of the present invention. The semiconductor integrated circuit device of the ninth embodiment is different from the semiconductor integrated circuit device of the seventh embodiment shown in FIG. 12 to FIG. 14B in that a connection portion 26 is formed between the blow spot central portions C and the terminals-B 22. The basic operation of the connection portion 26 is similar to the connection portion 23 in the seventh embodiment shown in FIG. 12.

According to the ninth embodiment of the present invention, the wiring resistance between each of the blow spot central portions C and the grounding potential $V_{SS}$ side can be reduced in accordance with the operation of the connection portion 26 in which the fuses 20 are formed integrally with the corresponding adjacent other fuses 20. Therefore, an amount of electric charges which originate from the surge current in the phase of the fuse 20 blowing and which are caused to flow into each of the internal circuits 30 can be reduced, and thus the breaking of each of the internal circuits 30 can be efficiently suppressed, thereby protecting each of the internal circuits 30 from the surge current.

Note that, the ninth embodiment of the present invention can also be used together with the first, second and fifth embodiments.

It should be noted that the present invention is not intended to be limited to the above-mentioned embodiments, and the various changes can be implemented by those skilled in the art without departing from the gist of the invention. Also, the constituent elements of the above-mentioned embodiments can be arbitrarily combined with one another without departing from the gist of the invention.

What is claimed is:

1. A semiconductor integrated circuit device comprises:
 a semiconductor substrate;
 an internal circuit formed on the semiconductor substrate, a first potential and a second potential being supplied to the internal circuit, thereby applying an operating voltage to the internal circuit;
 a fuse disposed above a semiconductor region of a first conductivity type, and electrically connected to the internal circuit, the semiconductor region being supplied with the second potential and being formed in the semiconductor substrate, the fuse having a blow spot as a region in which cutting is adapted to occur, the fuse being interposed between a first wiring to which the second potential is supplied and a second wiring electrically connected to the internal circuit;
 a protective element formed in the semiconductor region of the first conductivity type and protecting the internal circuit in response to positive and negative abnormal voltages generated in the second wiring; and
 a guard ring containing a highly concentrated impurity of the first conductivity type and formed within the semiconductor region of the first conductivity type, the fuse being disposed so that the blow spot is located above a region surrounded with the guard ring, the protective element being formed in the semiconductor region of the first conductivity type outside the region surrounded with the guard ring.

2. The semiconductor integrated circuit device according to claim 1, wherein the protective element is a MISFET comprising a drain or a source and a gate to which the second potential is supplied, and the source or the drain of the MISFET is connected to the second wiring.

3. The semiconductor integrated circuit device according to claim 1, wherein the fuse is connected to the internal circuit through a resistor.

4. The semiconductor integrated circuit device according to claim 1, further comprising:
 another internal circuit electrically connected to the internal circuit through the fuse, the first potential and the second potential being supplied to the another internal circuit, thereby applying the operating voltage to the another internal circuit; and another protective element formed in the semiconductor region of the first conductivity type and protecting the another internal circuit in response to positive and negative abnormal voltages generated in a wiring through which the fuse and the another internal circuit are connected to each other.

5. The semiconductor integrated circuit device according to claim 4, wherein the fuse is connected to the internal circuit through a first resistor, and is connected to the another internal circuit through a second resistor.

6. The semiconductor integrated circuit device according to claim 1, wherein the first wiring is connected to the guard ring through a plug.

7. The semiconductor integrated circuit device according to claim 1, further comprising a secondary fuse disposed between the fuse and the internal circuit, and formed so as to be adapted to be broken by a surge current generated when the fuse is cut.

8. The semiconductor integrated circuit device according to claim 1, wherein the plurality of fuses are interposed between the first wiring and the second wiring, and have a connection portion, in which the plurality of fuses are formed integrally with the corresponding adjacent other fuses, on the first wiring side with respect to each of centers of the blow spots.

* * * * *